United States Patent
Chan et al.

(10) Patent No.: US 9,384,791 B1
(45) Date of Patent: Jul. 5, 2016

(54) APPARATUS AND METHOD FOR SENSE AMPLIFIER OFFSET CANCELLATION

(71) Applicant: ALTERA CORPORATION, San Jose, CA (US)

(72) Inventors: Allen K. Chan, San Jose, CA (US); Vishal Giridharan, San Jose, CA (US); Syed Reza Bahadur, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/586,549

(22) Filed: Dec. 30, 2014

(51) Int. Cl.
  *G11C 7/06* (2006.01)
  *G11C 7/10* (2006.01)
(52) U.S. Cl.
  CPC ............... *G11C 7/06* (2013.01); *G11C 7/1051* (2013.01)
(58) Field of Classification Search
  CPC .... G11C 7/06; G11C 7/1051; G11C 11/2273; G11C 11/4091; G11C 13/004
  See application file for complete search history.

(56) References Cited

U.S. PATENT DOCUMENTS

| | | |
|---|---|---|
| 5,729,492 A | 3/1998 | Campardo |
| 8,362,807 B2 | 1/2013 | Upputuri et al. |
| 2002/0040420 A1* | 4/2002 | Yamauchi ............ G11C 7/1006 711/118 |
| 2011/0140773 A1* | 6/2011 | Lee ......................... G11C 7/06 330/102 |

* cited by examiner

*Primary Examiner* — Khamdan Alrobaie
(74) *Attorney, Agent, or Firm* — Okamoto & Benedicto LLP

(57) ABSTRACT

Disclosed is a circuit architecture for cancellation of threshold voltage offsets for an array of sense amplifiers. An offset calibration controller, which may be embedded as a hardwired circuit in the transceiver core circuits, writes the offset adjustment values to a memory-mapped interface circuit. The memory-mapped interface circuit outputs the offset adjustment values to offset adjustment circuits for the sense amplifiers. The offset adjustment circuits may utilize a body bias technique. Advantageously, the disclosed circuit architecture provides for the minimization of residual offset without sacrificing bandwidth. Other embodiments, features and advantages are also disclosed.

17 Claims, 6 Drawing Sheets

US 9,384,791 B1

APPARATUS AND METHOD FOR SENSE AMPLIFIER OFFSET CANCELLATION

BACKGROUND

1. Technical Field

The present invention relates generally to electronic circuitry. More particularly, the present invention relates to apparatus and methods for sense amplifier offset cancellation.

2. Description of the Background Art

A sense amplifier may be used to amplify a differential signal across two inputs. While the two transistors of the input differential pair are generally designed to be the same, they are often not identical in practice due to process variation during manufacture. In particular, the process variation may cause the two transistors of the input differential pair to have different threshold voltages. In that case, the sense amplifier may be said to have an offset at the two inputs caused by the mismatch between the two transistors.

SUMMARY

Disclosed is a circuit architecture for cancellation of threshold voltage offsets for an array of sense amplifiers. An offset calibration controller, which may be embedded as a hard-wired circuit in the transceiver core circuits, writes the offset adjustment values to a memory-mapped interface circuit. The memory-mapped interface circuit outputs the offset adjustment values to offset adjustment circuits for the sense amplifiers. The offset adjustment circuits may utilize a body bias technique. Advantageously, the disclosed circuit architecture provides for the minimization of residual offset without sacrificing bandwidth.

Other embodiments, features and advantages are also disclosed. The embodiments disclosed include, but are not limited to, the following.

One embodiment relates to a circuit including an array of sensor amplifiers and circuits for adjusting threshold voltage offsets for the sensor amplifiers in the array. A memory circuit outputs offset adjustment values for the plurality of sensor amplifiers to the circuits for adjusting threshold voltage offsets, and an offset calibration controller writes the offset adjustment values to the memory circuit.

Another embodiment relates to a method of offset cancellation for an array of a plurality of sense amplifiers. A memory address in a memory circuit is selected. An offset adjustment value is written to the memory address, which adjusts the offset of the sense amplifier corresponding to the memory address. An output of a sense amplifier is then captured, and a check is made as to whether the output of the sense amplifier satisfies a done condition that indicates the offset of the sense amplifier has been properly calibrated.

Another embodiment relates to a system for calibrating a plurality of sense amplifiers. The system includes circuits for adjusting threshold voltage offsets for the plurality of sense amplifiers. A memory circuit outputs offset adjustment values for the plurality of sensor amplifiers to the circuits for adjusting threshold voltage offsets. An offset calibration controller writes the offset adjustment values to the memory circuit.

DETAILED DESCRIPTION

A prior scheme for sense amplifier offset cancellation uses a capacitive delay to retard the regeneration stage to induce a compensating offset. However, this prior scheme has various issues and challenges. First, a larger offset requires enabling larger capacitors, and larger capacitors decrease the bandwidth of the circuit due to the large RC (resistor-capacitor) circuit delay. Second, larger capacitors require larger areas to be used on an integrated circuit chip. Third, using a capacitive delay makes it difficult to implement small granularity in generating the compensating offset. This difficulty of making fine adjustments to the compensating offset is due to the physical limitations of the number and permutation of capacitors that can be implemented.

In addition, a prior scheme for sense amplifier offset cancellation implements a calibration controller using logic implemented within a programmable fabric of a field programmable gate array (FPGA). While such an implementation provides flexibility, it also requires added complexity due to the need for control bus arbitration when multiple channels are used. This results in increased initialization time when the offsets are calibrated sequentially per channel. Moreover, signal congestion is increased due to the required signals traveling from the core circuits for the transceiver channels into the FPGA fabric.

The present disclosure provides solutions for the above-discussed issues and challenges. Advantageously, the apparatus and methods disclosed herein provides a capability to minimize residual offset without sacrificing bandwidth.

The circuit architecture disclosed herein compensates the intrinsic sense amplifier offset using an offset cancellation controller implemented with hard-wired circuitry implemented at the transceiver core. A memory mapped interface is used to solve limitations of the prior scheme by allowing for finer granularity offset control while addressing the signal congestion issue.

Figure 1:
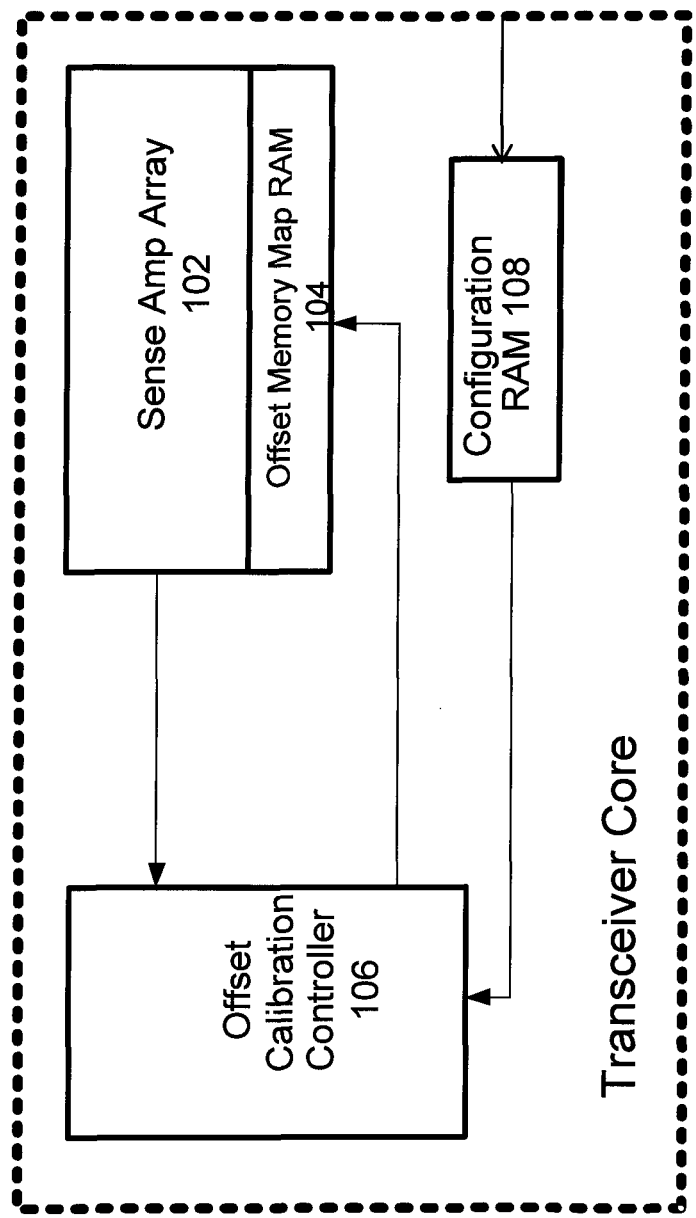
FIG. 1 is a diagram of an exemplary apparatus for sense amplifier offset cancellation with a circuit architecture in accordance with an embodiment of the invention.

FIG. 1 is a diagram of an exemplary apparatus 100 for sense amplifier offset cancellation with a circuit architecture in accordance with an embodiment of the invention. In an exemplary implementation, the apparatus 100 may be implemented as hard-wired circuitry in a transceiver core circuit on an integrated circuit.

As shown, the apparatus includes a sense amplifier array 102 and configuration RAM 108. However, instead of using the output of the configuration RAM 108 to directly configure the sense amplifier array 102, the apparatus provides an offset memory map random access memory (offset memory map RAM) 104 which provides outputs to control the sense amplifier array 102. The offset memory map RAM 104 may be abutted to the sense amplifier array 102 in the layout so as to minimize the length of the wide bus of data between them.

The apparatus 100 further includes an offset calibration controller 106 that receives the output of the configuration RAM 108 and provides the input to the offset memory map RAM 104. The offset calibration controller 106 also receives the output of the sense amplifier array 102 for purposes of calibration.

Figure 2:
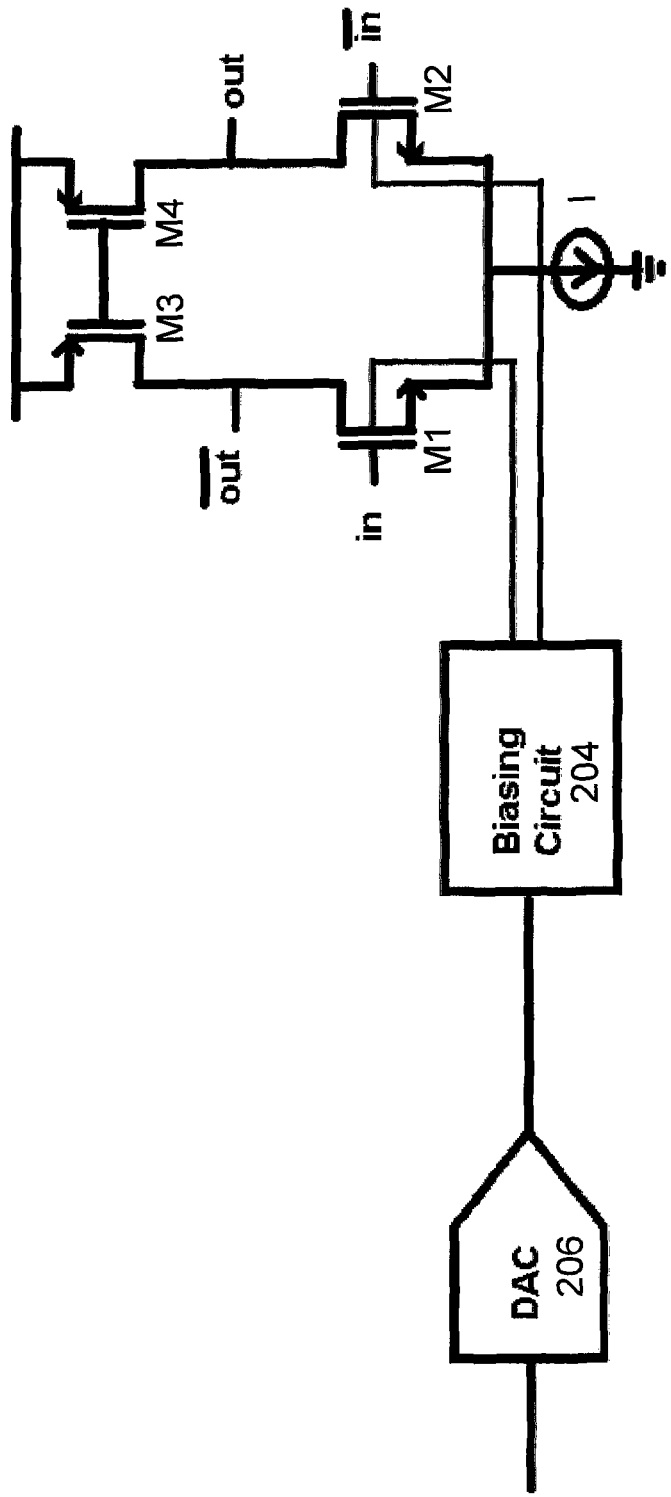
FIG. 2 depicts exemplary circuitry for adjusting an offset of an individual sense amplifier in accordance with an embodiment of the invention.

FIG. 2 depicts exemplary circuitry for adjusting an offset of an individual sense amplifier 202 in accordance with an embodiment of the invention. In an exemplary implementation, the sense amplifier array 102 in FIG. 1 may include multiple such sense amplifiers 202 arranged in an array.

As depicted, the sense amplifier 202 may include four transistors (M1, M2, M3 and M4) and a current source (I). The sources of M1 and M2 may be connected to the current source, and the sources of M3 and M4 may be connected to a power supply node. The differential input signal (in) may be received by the gates of M1 and M2, and the differential output signal (out) may be output from a first output node connected to the drains of M1 and M3 and a second output node connected to the drains of M2 and M4.

The analog control signal to the biasing circuit 204 may be provided by a digital-to-analog conversion (DAC) circuit 206. The DAC circuit 206 converts a digital control signal to an analog control signal.

Unlike a prior circuit that uses a capacitive delay to retard the regeneration stage to induce a compensating offset, the biasing circuit 204 controls the body bias (substrate bias) voltages for the input differential pair of transistors (M1 and M2). Controlling the body bias voltage for a transistor allows the threshold voltage for that transistor to be controlled according to the following equation.

$$V_{TB} = V_{T0} + \gamma(\sqrt{V_{SB}+2\phi_B} - \sqrt{2\phi_B})$$ (Eq. 1)

In the above equation: $V_{TB}$ is the threshold voltage when the body bias is present; $V_{T0}$ is the threshold voltage with zero substrate bias; $\gamma$ is the body effect parameter; $V_{SB}$ is the source-to-body substrate bias; and $2\phi_B$ is the surface potential.

This technique of controlling the threshold voltages for the input differential pair of transistors provides for offset cancellation by trimming away the threshold voltage mismatch between the two transistors. Such threshold voltage mismatches may be caused by process variations.

By controlling body bias for the input differential pair, this offset cancellation technique allows for high-speed precharging with little increase in power dissipation. In addition, substrate leakage current may be decreased, and a high current efficiency may be achieved.

Compared to a conventional circuit that utilizes a capacitive delay to cancel the offset, the circuit using the body bias control method may have a higher bandwidth. In addition, using the body bias control method, granularity is better controlled versus the capacitor method. The tighter input offset distribution that is possible with the body bias control method allows for better control of the offset cancellation.

Figure 3:
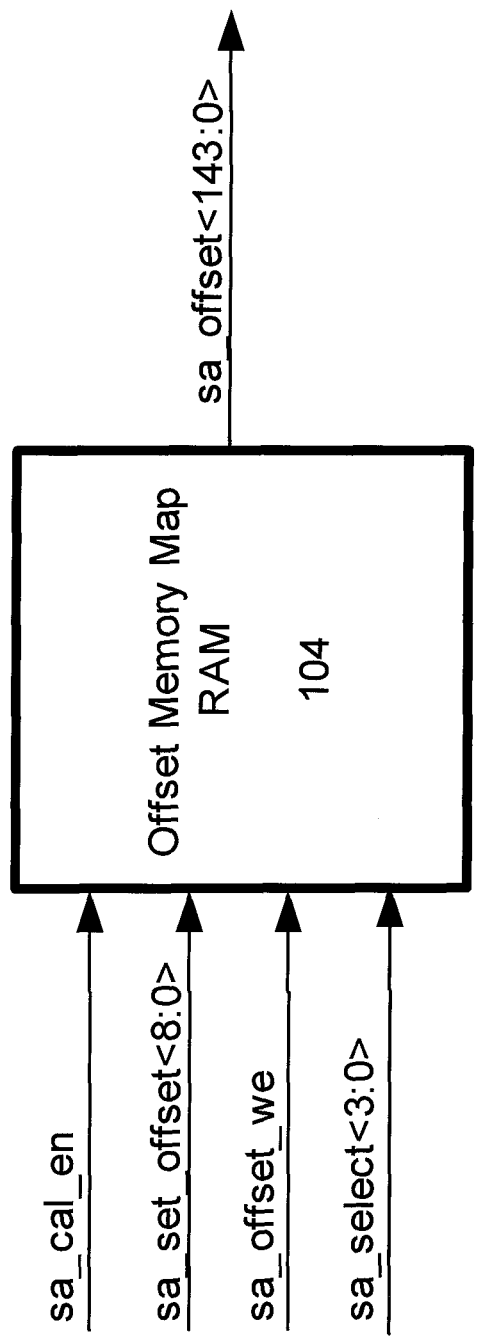
FIG. 3 depicts inputs and outputs of an exemplary offset memory map RAM in accordance with an embodiment of the invention.

FIG. 3 depicts inputs and outputs of an exemplary offset memory map RAM 104 in accordance with an embodiment of the invention. The exemplary offset memory map RAM 104 depicted is for an embodiment with sixteen sense amplifiers 202 with nine-bit resolution for the offset.

As shown, the input signals to the offset memory map RAM 104 may include a sense amplifier calibration enable (sa_cal_en) signal, a sense amplifier set offset (sa_set_offset<8:0>), a sense amplifier offset write enable (sa_offset_we), and a sense amplifier select (sa_select<3:0>). As further shown, the output signal from the offset memory map RAM 104 may be a sense amplifier offset (sa_offset<143:0>).

The offset memory map RAM 104 may be used to sequentially load offset data per sense amplifier. Advantageously, the offset memory map RAM 104 functions as a bus expander that accepts a shallow bus and converts it to a wider bus.

In the particular implementation illustrated in FIG. 3, the four selection bits (sa_select<3:0>) are used for sixteen sense amplifiers. The nine offset control bits (sa_set_offset<8:0>) are to provide 9-bit resolution for the offset cancellation. In this case, the offset memory map RAM (memory map interface) advantageously requires only 15 bits for the input bus, while the output bus provides 144 bits (9 bits to the offset cancellation circuitry of each of the 16 sense amplifiers).

Figure 4:
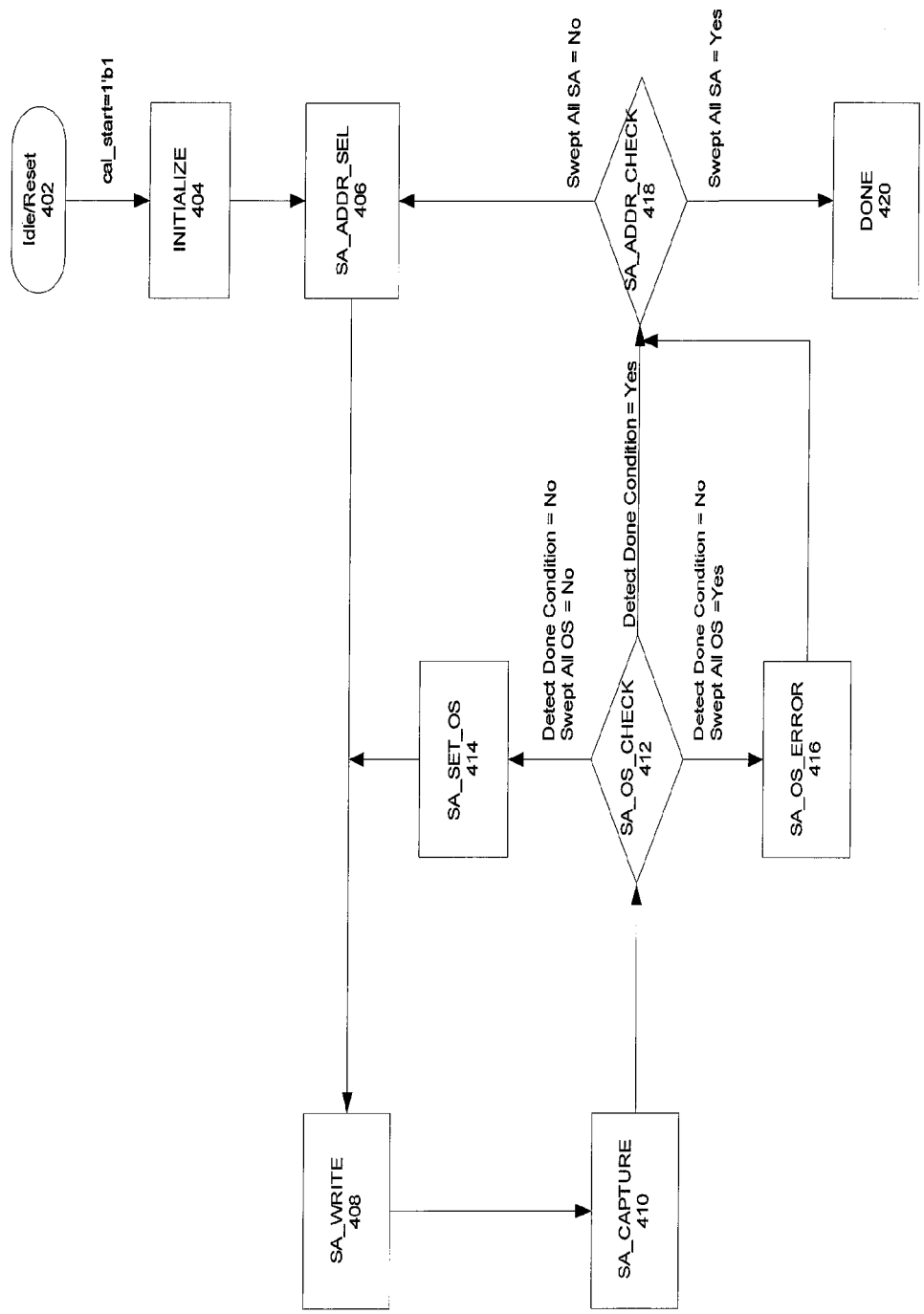
FIG. 4 is a flow chart depicting an exemplary method performed by the offset calibration controller in accordance with an embodiment of the invention.

FIG. 4 is a flow chart depicting an exemplary method 400 performed by the offset calibration controller 106 in accordance with an embodiment of the invention. The method 400 is performed to calibrate the offsets of the sense amplifiers in the sense amplifier array 102.

As shown, the offset calibration controller 106 may begin in an idle or reset state (Idle/Reset) 402. The offset calibration controller 106 may wait in the Idle/Reset state 402 until a calibration start (cal_start) signal is asserted (for example, goes to the high state 1'b1). Once the calibration start is asserted, the offset calibration controller 106 may initialize the calibration procedure per step 404 (INITIALIZE).

After initialization, control signals to the offset memory map RAM 104 are set so as to select a memory address in the offset memory map RAM 104 per step 406 (SA_ADDR_SEL). The memory address may be associated with an individual sense amplifier (the selected sense amplifier) in the sense amplifier array 102. In addition to selecting the memory address, the offset adjustment value (OS) may be set to an initial value (for example, a lowest value).

Per step 408 (SA_WRITE), a write signal is asserted to register data in the offset memory map RAM 104. The data written includes an offset adjustment value (OS) to be tested for the selected sense amplifier.

Per step 410 (SA_CAPTURE), the output of the selected sense amplifier may then be polled to capture "offset data". The offset data (i.e. the sense amplifier output) should be near zero if the offset adjustment value substantially cancels the built-in offset of the transistor pair at the differential input of the selected sense amplifier.

Per step 412 (SA_OS_CHECK), the offset data from the selected sense amplifier is checked. In one implementation, a "done condition" may be detected if the offset data indicates that the magnitude of the output of the sense amplifier is below a predetermined threshold. The done condition indicates that the offset adjustment value sufficiently cancels the built-in offset for the selected sense amplifier. If the done condition is not detected in step 412, then a further determination may be made as to whether all offset adjustment values (OS) have been swept (i.e. tested).

If it is determined in step 412 that no done condition is detected and not all offset adjustment values have been swept, then the offset adjustment value may be changed to a different value per step 414 (SA_SET_OS). In one implementation, the offset adjustment value (OS) may be incremented to a next value. Thereafter, the method 400 may loop back to step 408 so as to test this next value.

If it is determined in step 412 that no done condition is detected and all offset adjustment values have been swept, then an offset calibration error may be flagged for the selected sense amplifier per step 416 (SA_OS_ERROR). This step handles the state where all the offset adjustment values have been swept, but the offset done condition was never satisfied. In this case, the method 400 moves forward to step 418.

Finally, if the done condition is detected in step 412, then an acceptable offset adjustment value has been found for the selected sense amplifier, such that the selected sense amplifier built-in offset has been cancelled. In this case, the method 400 moves forward to step 418.

Per step 418 (SA_ADDR_CHECK), a determination may be made as to whether or not all the sense amplifiers in the array have been calibrated. In other words, it is determined whether the method 400 has already swept through the entire memory address range for the sense amplifiers in the array.

If not all the sense amplifiers in the array have been calibrated, then the method 400 moves on to calibrate a next sense amplifier in the array by looping back to step 406 to select the memory address that is associated with the next sense amplifier. On the other hand, if all the sense amplifiers in the array have been calibrated, then the calibration may be deemed complete per step 420.

Example FPGA

Figure 5:
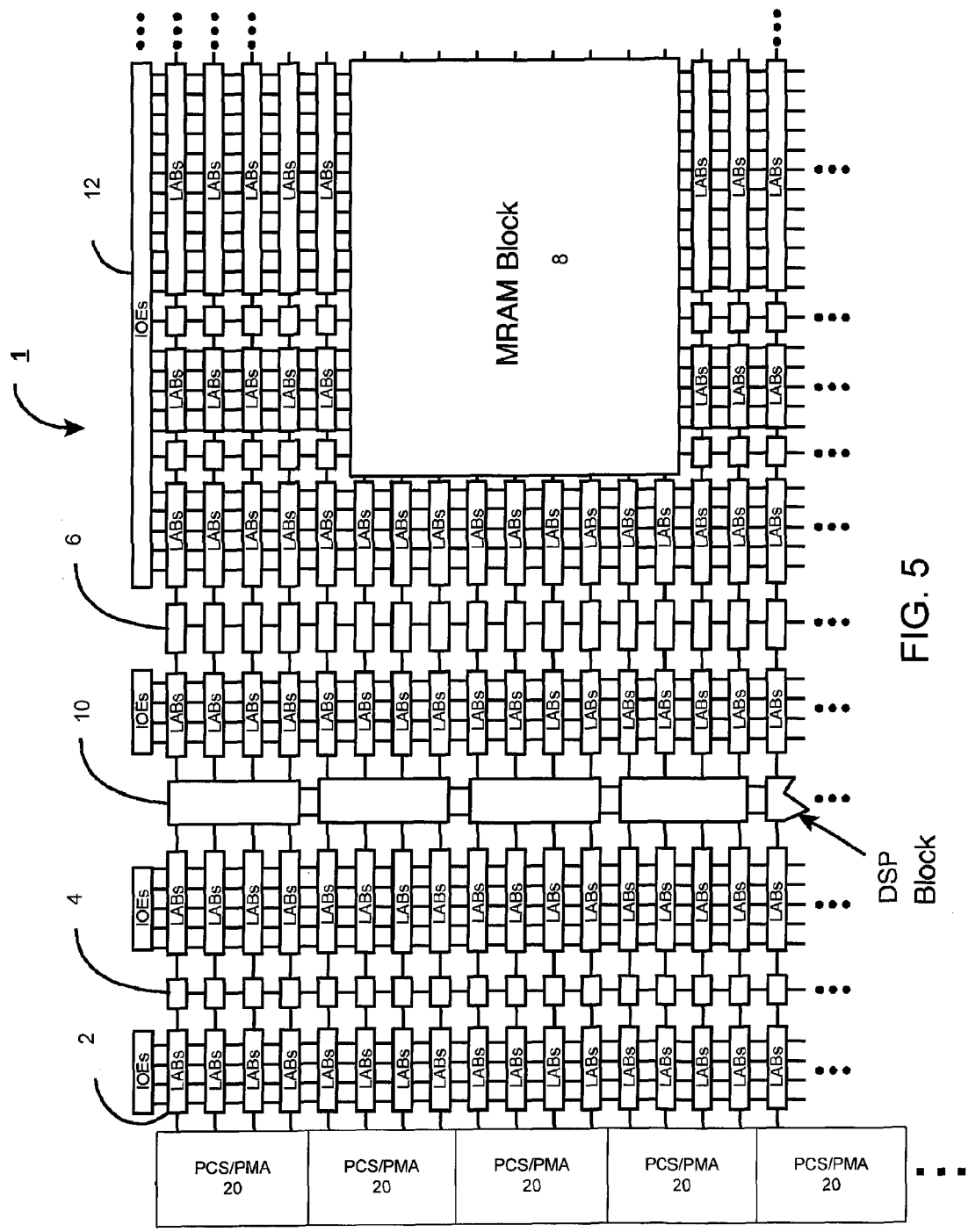
FIG. 5 is a simplified partial block diagram of a field programmable gate array (FPGA) that can include aspects of the present invention.

FIG. 5 is a simplified partial block diagram of a field programmable gate array (FPGA) 1 that can include aspects of the present invention. In one embodiment, the integrated circuit on which transceiver core 100 is implemented may be such an FPGA. It should be understood that, in accordance with other embodiments, the present invention may be implemented and used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 1 includes within its "core" a two-dimensional array of programmable logic array blocks (or LABs) 2 that are interconnected by a network of column and row interconnect conductors of varying length and speed. LABs 2 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 1 may also include a distributed memory structure including random access memory (RAM) blocks of varying sizes provided throughout the array. The RAM blocks include, for example, blocks 4, blocks 6, and block 8. These memory blocks can also include shift registers and FIFO buffers.

FPGA 1 may further include digital signal processing (DSP) blocks that can implement, for example, multipliers with add or subtract features. Input/output elements (IOEs) 12 located, in this example, around the periphery of the chip support numerous single-ended and differential input/output standards. Each IOE 12 is coupled to an external terminal (i.e., a pin) of FPGA 1. PMA/PCS channel circuits 20 may also be provided with each PMA/PCS channel circuit 20 being coupled to several LABs.

It is to be understood that FPGA 1 is described herein for illustrative purposes only and that the present invention can be implemented in many different types of PLDs, FPGAs, and ASICs.

Example Digital System

Figure 6:
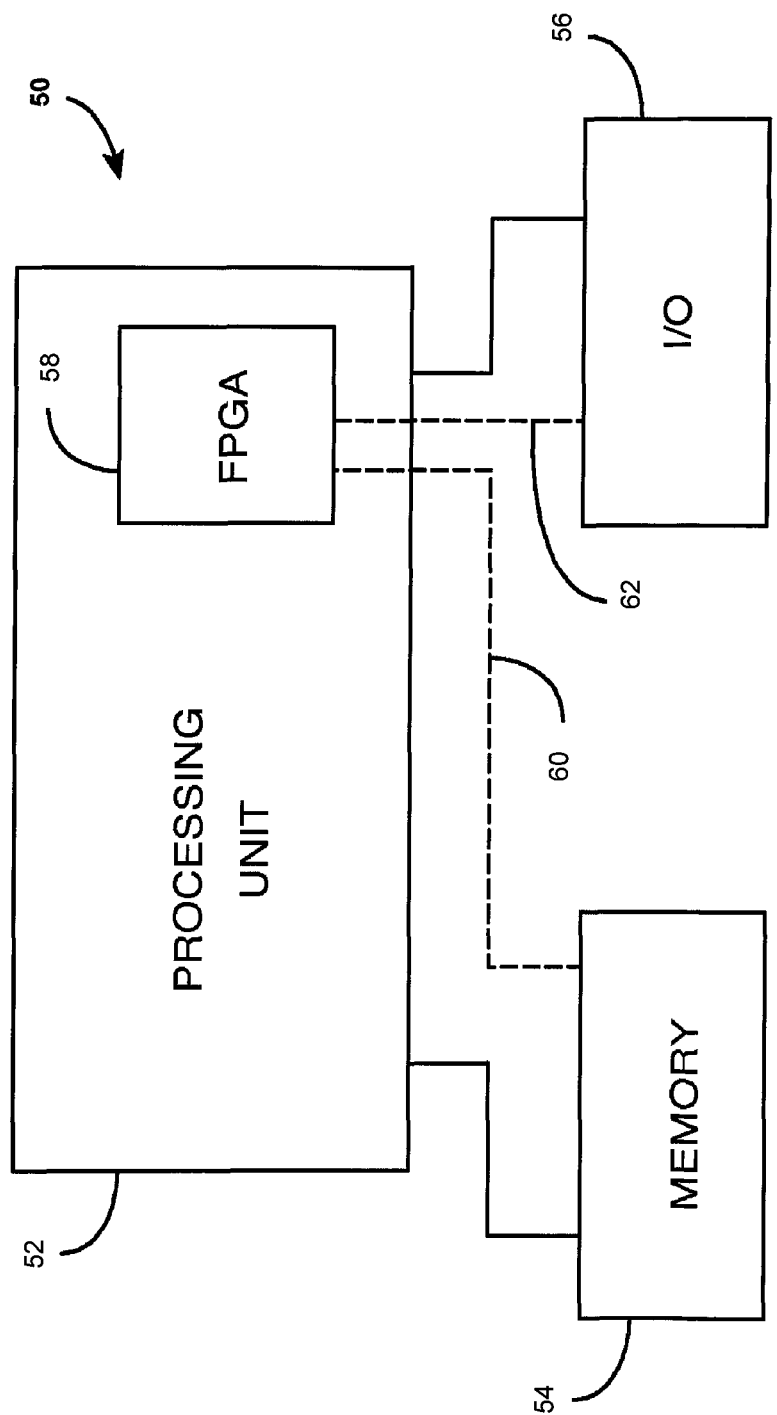
FIG. 6 is a block diagram of an exemplary digital system that can employ techniques of the present invention.

FIG. 6 shows a block diagram of an exemplary digital system 50 that can embody techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

CONCLUSION

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A circuit comprising:
an array comprising a plurality of sensor amplifiers and circuits for adjusting threshold voltage offsets for the plurality of sensor amplifiers;

a memory circuit that outputs offset adjustment values for the plurality of sensor amplifiers to the circuits for adjusting threshold voltage offsets; and an offset calibration controller that writes the offset adjustment values to the memory circuit, wherein the circuits for adjusting threshold voltage offsets comprises for each one of the plurality of sensor amplifiers:

a biasing circuit that applies a voltage bias between body nodes of two differential input transistors; and a digital-to-analog converter that receives a digital offset adjustment value from the memory circuit and outputs an analog offset adjustment value to the biasing circuit.

2. The circuit of claim 1, wherein the offset adjustment values are written serially to the memory circuit, and wherein the memory circuit outputs the offset adjustment values in parallel to the circuitry for adjusting threshold offset voltages.

3. The circuit of claim 2, wherein the memory circuit comprises a random access memory, wherein memory addresses in the random access memory correspond to sense amplifiers in the array; and wherein an output bus to the random access memory is wider than an input bus of the random access memory.

4. The circuit of claim 1, wherein the offset calibration controller executes a loop of steps comprising:

selecting a memory address in the memory circuit, wherein the memory address corresponds to a sense amplifier in the array;

writing an offset adjustment value to the memory address;

capturing an output of the sense amplifier; and checking whether the output of the sense amplifier satisfies a done condition that indicates calibration of the sense amplifier is done.

5. The circuit of claim 4, wherein the calibration controller sets the offset adjustment value to a next value when the done condition is not satisfied.

6. The circuit of claim 4, wherein the calibration controller selects a next memory address when the done condition is satisfied.

7. The circuit of claim 1, wherein the circuit is an integrated circuit on a semiconductor chip, and wherein the offset cancellation controller is implemented in hard-wired circuitry in the integrated circuit.

8. The circuit of claim 1, further comprising:

configuration memory that holds data for configuring the offset calibration controller.

9. A method of offset cancellation for an array of a plurality of sense amplifiers, the method comprising:

selecting a memory address in a memory circuit, wherein the memory address corresponds to a sense amplifier in the array;

writing an offset adjustment value to the memory address;

capturing an output of the sense amplifier; and checking whether the output of the sense amplifier satisfies a done condition that indicates calibration of the sense amplifier is done, wherein the offset adjustment value is applied to the sense amplifier using a biasing circuit that applies a voltage bias between body nodes of two differential input transistors of the sense amplifier.

10. The method of claim 9, further comprising:

setting the offset adjustment value to a next value when the done condition is not satisfied.

11. The method of claim 9, further comprising:

selecting a next memory address when the done condition is satisfied.

12. The method of claim 9, wherein the memory circuit comprises an output bus that is wider than an input bus.

13. The method of claim 9, wherein offset adjustment values are written serially to the memory circuit, and wherein the offset adjustment values are output in parallel from the memory circuit to circuits for adjusting threshold offset voltages of the plurality of sense amplifiers in the array.

14. A system for calibrating a plurality of sense amplifiers, the system comprising:

circuits for adjusting threshold voltage offsets for the plurality of sense amplifiers;

a memory circuit that outputs offset adjustment values for the plurality of sensor amplifiers to the circuits for adjusting threshold voltage offsets; and an offset calibration controller that writes the offset adjustment values to the memory circuit, wherein the circuits for adjusting threshold voltage offsets comprises for each one of the plurality of sensor amplifiers:

a biasing circuit that applies a voltage bias between body nodes of two differential input transistors.

15. The system of claim 14, wherein the offset adjustment values are written serially to the memory circuit, and wherein the memory circuit outputs the offset adjustment values in parallel to the circuitry for adjusting threshold offset voltages.

16. The system of claim 15, wherein the memory circuit comprises a random access memory, wherein memory addresses in the random access memory correspond to sense amplifiers in the array; and wherein an output bus to the random access memory is wider than an input bus of the random access memory.

17. The system of claim 14, wherein the offset calibration controller selects a memory address in the memory circuit, writes an offset adjustment value to the memory address, capturing an output of a sense amplifier corresponding to the memory address, and checking whether the output of the sense amplifier satisfies a done condition that indicates calibration of the sense amplifier is done.

* * * * *